United States Patent [19]

Wang

[11] Patent Number: 5,520,986
[45] Date of Patent: May 28, 1996

[54] DIFFUSION PATTERNING PROCESS AND SCREEN THEREFOR

[75] Inventor: Carl B. Wang, Tokyo, Japan

[73] Assignee: E. I. Du Pont de Nemours and Company, Wilmington, Del.

[21] Appl. No.: 363,848

[22] Filed: Dec. 27, 1994

Related U.S. Application Data

[62] Division of Ser. No. 139,442, Oct. 21, 1993, Pat. No. 5,411,628.

[51] Int. Cl.$^6$ ............................................. B32B 9/00
[52] U.S. Cl. ....................... 428/131; 118/213; 118/406; 118/504; 427/282
[58] Field of Search ........................... 427/282; 118/213, 118/406, 504

[56] References Cited

U.S. PATENT DOCUMENTS

| | | | |
|---|---|---|---|
| 1,804,508 | 5/1931 | Nicholson | 427/282 |
| 5,032,216 | 7/1991 | Felten | 156/628 |
| 5,209,814 | 5/1993 | Felten et al. | 156/628 |
| 5,260,163 | 11/1993 | Nebe et al. | 430/198 |
| 5,275,689 | 1/1994 | Felten et al. | 156/628 |

*Primary Examiner*—Patrick J. Ryan
*Assistant Examiner*—Kam F. Lee

[57] ABSTRACT

A non photographic method for making patterns in organic films comprising the sequential step:

a) applying in predetermined pattern an imaging layer comprising an agent which is capable of changing the solubility of a solid organic polymer in at least one unpatterned layer laying in contact with solid imaging layer to form the compiled body on a substrate by screen printing with a screen having a plurality of apertures of polygon of which each side is recessed, b) drying the unpatterned layer fully or partially at a predetermined temperature to diffuse said solubility change agent from the imaging layer to the unpatterned dielectric layer(s) and c) removing the patterned imaging layer and the diffusion patterned areas of the unpatterned layer(s) which are both soluble in a predetermined eluant, by washing said compiled body with the predetermined eluant.

Additionally, the following step d can be used to substitute step a above and combined with steps b and c to make fine channel type patterns in organic films:

d) applying in predetermined pattern an imaging layer comprising an agent which is capable of changing the solubility of a solid organic polymer in at least one unpatterned dielectric layer laying in contact with solid imaging layer to form the compiled body on a substrate by screen printing with a screen having a plurality of grouped apertures comprising of relatively smaller size apertures with predetermined spacing.

5 Claims, 6 Drawing Sheets

DIFFUSION PATTERNING PROCESS AND SCREEN THEREFOR

This a division of application Ser. No. 08/139,442, filed Oct. 21, 1993 now U.S. Pat No. 5,411,628.

FIELD OF INVENTION

The invention is directed to a diffusion patterning process for organic polymer films. More specifically, it is directed to (1) an improved emulsion opening design of screen (for screen printing) suitable for producing straight edge features of screen printed diffusion patterning paste and (2) a grouped aperture design of the screen suitable for producing fine channels by the above process.

BACKGROUND OF THE INVENTION

Multilayer thick film circuits have been used for many years to increase circuit functionality per unit area. Conventionally thick film materials are deposited onto substrates by printing through screens having a desired pattern. One major problem associated with patterning thick film in multilayer configuration is the limited resolution capability by screen printing. In addition, this multilayer approach requires excessive printing and firing steps which adversely effects the mass-productivity and is more expensive. Repeating the printing and firing steps limits the resolution of patterns, and also requires stringent control of thickness for each layer, realignment between the layers and careful processes to avoid blistering and cracking.

A diffusion patterning process as disclosed by Felton in U.S. Pat. No. 5,032,916 can overcome these drawbacks.

In this method, a first layer of non photosensitive polymeric material is applied to a substrate in an unpatterned manner, followed by a second non photosensitive layer with a pattern. Agent(s) from the second patterning layer diffuses downward into the first layer effecting a change in the dispersibility of that layer. The second layer and those areas having greater dispersibility in the first layer by the above action are then removed by washing with a predetermined eluant. For electronic applications, the functional material is contained in the first layer, which is fired after the washing step. As screen printing is pertinent to this invention and has been one of the most commonly used thick film application method, a brief summary of which is provided below.

The screen is one of the most important part of the screen printing equipment. It is responsible for the definition of the printed pattern and is also the major factor controlling the thickness of thick film paste deposited on the substrate surface. During the printing process the squeegee forces paste through the open areas of the screen and at the same time presses the screen into close contact with the substrate, so forming a seal which minimizes sideways spread of the paste between the face of the screen and the substrate.

There are currently two main types 1 of screens available, the conventional mesh based screen and the etched foil stencil. In the later type a sheet of metal foil, such as stainless steel, copper, bronze, or nickel is stretched across a rigid metal frame and selectively etched to produce the required opening pattern. However, the majority of screens used in microelectronic printing are of the mesh type, the basis of which is tightly woven mesh fixed to a rigid metal frame, the openings of the mesh being selectively covered to form a pattern. The patterns are produced by coating the mesh with photosensitive emulsions or films, followed by photo imaging process. Alternatively, etched metal foils may also be attached to the face of the screen. Photosensitive coating materials fall into three main groups: emulsion, which is a viscous fluid; direct film, which is a photosensitive film attached to the mesh prior to pattern development; and indirect film on which the pattern is formed before the film is fixed to the mesh.

For simplicity this invention uses "emulsion opening" or "aperture" to represent the patterned open area on screens or stencils, regardless of materials or methods of their fabrication.

Figure 1A:
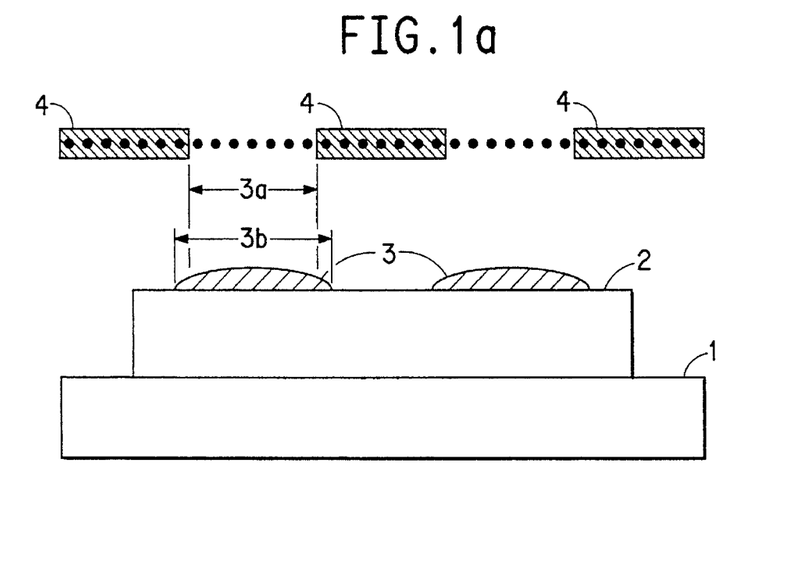
FIG. 1 is an illustration for showing lateral spreading and diffusion of diffusion patternable material in diffusion patterning process.
Figure 1B:
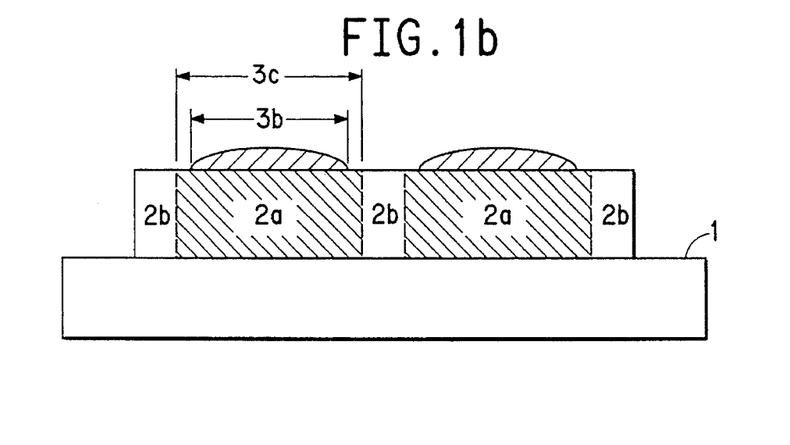
Figure 1C:
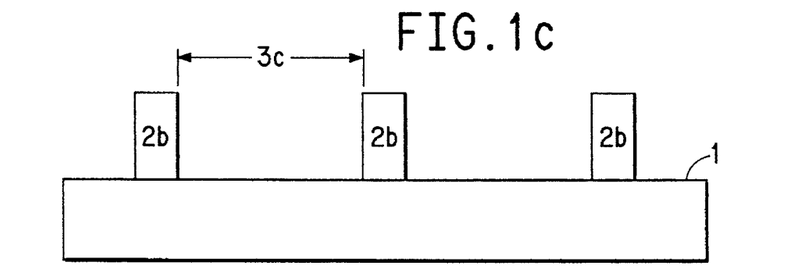

While diffusion patterning is versatile, fast and economical, it does have some limitation. In particular, like any conventional thick film pastes, a diffusing patternable material also tend to spread in the X-Y direction (lateral spreading) after screen printing. Such lateral spreading produces an enlarged circular deposition of material from a screen circular opening, but an enlarged plus semi-rounded deposition from a straight edge opening on screen. FIG. 1a shows that onto a substrate 1, an unpatterned layer 2 was printed, over which an imaging layer of width $3b$ was printed from a screen of opening size $3a$. Noting that $3b > 3a$ illustrates the lateral spreading. In addition, during a subsequent drying step, the agent contained in the second, imaging layer 3 also diffused in the X-Y direction (the so-called lateral diffusion), as it progressively diffused downward into the unpatterned layer 2 in the Z direction (vertical diffusion). This leads to, after the final washing step, an enlarged patterned features $3c$ versus $3b$, illustrating the effect of lateral diffusion. Both effects makes it particularly difficult to produce via holes, cavities or channels where straight edge and/or high aspect ratio are required.

Figure 2:
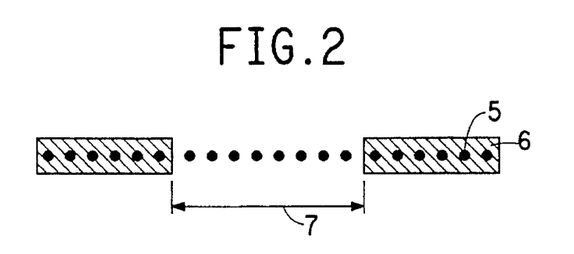

This invention utilizes both lateral spreading and diffusion effects to design improved emulsion opening geometry which can be used to form screens or stencils photographically, chemically, mechanically, or methods otherwise, and by screen printing to create precisely controlled patterns of a thick film paste as an imaging layer and produce desirable patterned features by completing the diffusion patterning process. FIG. 2 illustrates schematically one emulsion opening, in which part of the wire mesh 5 is covered with emulsion layer 6 to give an opening 7.

SUMMARY OF THE INVENTION

The invention is therefore directed to a diffusion patterning process for making patterns in organic polymer films comprising the following steps:

a) applying in predetermined pattern an imaging layer comprising an agent which is capable of changing the solubility of a solid organic polymer in at least one unpatterned dielectric layer laying in contact with solid imaging layer to form the compiled body on a substrate by screen printing with a screen having a plurality of apertures of polygon of which each side is recessed, b) drying the unpatterned layer fully or partially at a predetermined temperature to diffuse the solubility change agent from the imaging layer to the unpatterned dielectric layer(s) and c) removing the patterned imaging layer and the diffusion patterned areas of the dielectric layer(s) which are both soluble in a predetermined eluant, by washing the compiled body with the predetermined eluant.

As a second aspect the invention is directed to an improved screen opening design to make cavity features of straight edges, the design has a plurality of apertures of polygon of which each side is recessed, to utilize, in the diffusion patterning process, the effect of "lateral spreading" of printing the imaging layer and "lateral diffusion" of solubilizing agent into the layer directly in contact with the imaging layer.

As a third aspect the invention is directed to an improved screen opening design to make fine channel features, the design has a plurality of grouped apertures comprising of relatively smaller size apertures with predetermined spacing.

BRIEF DESCRIPTION OF THE DRAWINGS

FIG. 2 illustrates schematically basic structures of screen for screen printing, FIGS. 3 and 4 schematically illustrates diffusion of solubilizing agent and patterning resulting into forming cavity onto a substrate thereby, FIGS. 5 and 6 schematically depicts behavior of thick film deposit due to lateral spreading following the screen printing and lateral diffusion after drying.

DETAILED DESCRIPTION OF THE INVENTION

Definitions

As used herein the following terms have the indicated meanings:

The term "eluant" refers to any fluid, either liquid or gaseous, which is capable of dissolving or otherwise placing the underlying or overcoating unpatterned layer(s) into a dispersible form. As applied to the invention, the eluant is aqueous.

The term "dispersible" means with respect to a film of given material that the material is capable of displacement or removal by physical and/or chemical action of a wash liquid or by lifting off. As applied to the invention, the wash liquid is aqueous.

The term "partial drying" or "dry partially" means lower temperature and/or shorter drying time versus the condition normally applied to an assembly comprising of only imaging layer on top of unpatterned layer(s).

The term "volatile solvent" refers to liquid organic solvents which can be removed by evaporation at a temperature of 120° C. or less at one atmosphere.

The term "non-crystalline polymer" refers to solid organic polymers having no more than about 50% crystallinity.

The term "acidic polymer" refers to organic polymers having an acid number of 20–600.

The term "solvent free" refers to compositions from which volatile solvent has been removed substantially completely, i.e. the residual amount of volatile solvent is less than about 1% by weight of the remaining composition.

The terms "acrylate" and "acrylic" as used herein to describe monomers and polymers made therefrom include methacrylates as well as acrylates.

The term "positive curvature" means outward curvature from straight line connecting the adjacent vertices; whereas the term "negative curvature" or "recess" means inward curvature from straight line connecting the adjacent vertices.

DIFFUSION PATTERNING PROCESS

A. Thick Film Materials

The unpatterned thick film paste is comprised of finely divided particles of glass, metal, or other special function type such as phosphor dispersed in acrylic polymers dissolved in a mixture of plasticizer, dispersing agent, and organic solvent.

The paste for the imaging layer is a viscous liquid comprised of cellulose polymer binder dissolved in plasticizer, organic solvent and solubilizing agent.

B. Modified Diffusion Patterning Methods

Figure 3A:
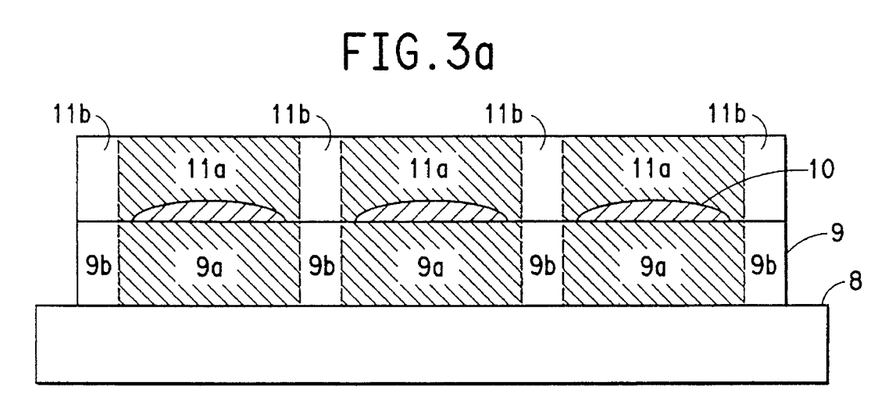
Figure 3B:
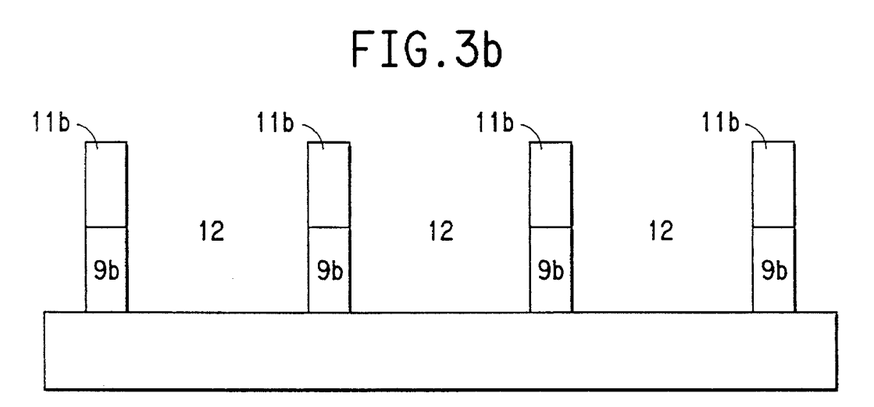

As shown in FIG. 3, unpatterned first layer 9 is applied to substrate 8 and the organic solvent is removed by heating at 70° to 90° C. for a period of about 5 to 10 minutes. An imaging layer 10 containing a solubilizing agent is then screen printed to the nearly solvent-free layer 9 with a screen having a plurality of apertures of polygon of which each side is recessed.

Diffusion of the solubilizing agent from the imaging layer 10 into the underlying areas 9a of the first layer 9 is carried out by partially drying the imaging layer 10 at 70° to 90° C. for 5 to 10 minutes during which the organic solvent is evaporated from the layer and both the solubilizing agent and plasticizer, are diffused into the underlying areas of layer 9a where the agent reacts with the acrylic polymer rendering it water dispersible. Subsequently other unpatterned layer 11 is applied to the imaging layer 10 and dried fully at 80° to 90° C. for 10 to 15 minutes to effect an upward diffusion of the solubizing agent into the overcoating layer 11a and to complete the downward diffusion to the underlying layer 9a. After diffusion is completed, the imaging layer 10 consists mainly of cellulose polymer, and small amounts of residual solubilizing agents and plasticizers. It is then washed with water having a pH of about 7 to remove the remaining components of the layer and the soluble materials in the diffused areas of thick film layer 9a and 11a. Upon completion of the washing, cavity 12 is formed and the undiffused area 9b and 11b remains intact, thus constituting a negative image of the pattern of layer 10.

Figure 4A:
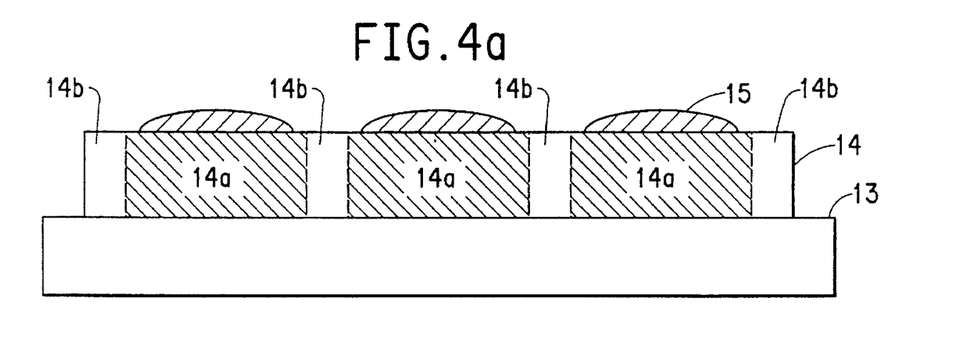
Figure 4B:
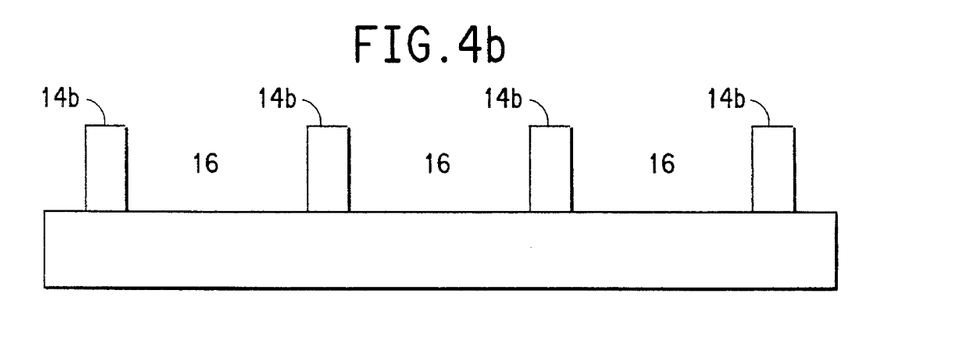

As per circuit design and shown in FIG. 4, it is likely that only one unpatterned layer 14 is needed. In this case, the imaging layer 15 is to be completely dried to effect a thorough diffusion of solubilizing agent into the area 14a. A subsequent washing step produces cavity 16 with undiffused area 14b remains intact.

C. Substrate

The method of the invention can be used on either inorganic substrates, such $Al_2O_3$, $SiO_2$, silicon, aluminum nitride and the like, or organic substrates,. such as polyimides, phenoxy resins, epoxy resins and the like, or composite substrates such as filled organic polymers, or metallic substrates such as stainless steel, aluminum, and the like. When the method of the invention is used for making thick film layers, upon completion of the washing step, the patterned thick film layer is fired to burn off the organic constituents and subsequently densify or sinter the finely divided solid particles.

D. Acid Polymer

The binder component of the unpatterned first layer, irrespective of the manner in which it is applied, must be film forming, non-crystalline and must contain a sufficient number of free acid groups that it has an acid number of 20–600. So long as the polymer is acidic to that extent, it will become water soluble or dispersible when it is exposed to the action of the diffused organic base, the solubilizing agent from the imaging layer. However, it is essential that the polymer not be water dispersible prior to reacting with the agent. Therefore, the acid number of the polymer should not exceed about 600. It is preferred that the acidic polymer have an acid number of 100–300. Non-crystallinity of the acidic polymer is essential in order to facilitate diffusion of both the plasticizer and the solubilizing agent containing solution from the imaging layer into the thick film layer.

It is essential that the acidic polymer be substantially soluble in the plasticizer used in the unpatterned layer Nevertheless, it is preferred that the polymer not be soluble in all proportions. Though the method of the invention can with difficulty be carried out with an homogeneous polymer layer, it is nevertheless preferred that the polymer be present with the plasticizer as a two-phase system. The interface between the phases serves as a path which facilitates diffusion of the solubilizing agent from the imaging layer in contact with the acidic polymer.

A wide variety of acid-containing polymers and copolymers can be used in the invention, such as acrylic polymers, styrene acrylic copolymers, vinyl addition polymers, styrene maleic anhydride copolymers, cellulose derivatives. Although the exact chemical composition of the acid moiety of the acidic polymer is not critical, the types most frequently used are copolymers of an ethylenically unsaturated acid such as acrylic acid, fumaric acid, vinyl sulfonic acid, itaconic acid, mathacrylic acid, crotonic acid and the like. The chemical nature of the polymer backbone is not of itself important so long as the polymer is (1) non-crystalline, (2) film-forming, (3) contains enough acidic groups so that it will undergo ionization upon exposure to basic solutions, and (4) is capable of forming a two-phase system with the plasticizer in the patterning layer. Within these criteria, the choice of polymers will be well within the skill of the known polymer art.

Though it is not necessary to do so, it will be realized that mixtures of acidic and non-acidic polymers can be used as binder for the unpatterned layer if it is desired to obtain special properties not otherwise obtainable from the acidic polymer alone. For example, it may in some instances be advantageous to use a mixture of acid-containing polymer with another acid-containing polymer or a non-acid containing polymer which has limited compatibility with the first acid-containing polymer to control the phase structure of the polymer film that is to be patterned. As a result, the solubilizing agent from the imaging layer can be more effectively diffused into the unpatterned layer(s) and reacts with the materials that are rich in acid functions, thereby causing the film structure within the imaged areas to collapse rapidly by washing with the predetermined eluant.

Examples of usable acidic polymers for this invention are listed in Table 1 below:

TABLE 1

| Composition and Properties of Acidic Polymers | | |
|---|---|---|
| Composition | Acid No. | M. Wt. |
| Poly(vinyl acetate) | 26 | 30,000 |
| Vinyl acetate/crotonic acid copolymer (95/5) | 36 | 30,000 |
| Cellulose acetate succinate | 136 | 30,000 |

TABLE 1-continued

| Composition and Properties of Acidic Polymers | | |
|---|---|---|
| Composition | Acid No. | M. Wt. |
| Ethyl acrylate/methyl methacrylate/acrylic acid copolymer (56/37/7) | 76–85 | 260,000 |
| Vinyl acid/crotonic acid/benzophenone copolymer | 77 | 50,000 |
| Vinyl chloride/vinyl acetate/maleic acid copolymer (81/17/2) | 26 | — |
| Fumaric acid, modified rosin ester | 110–130 | — |
| Styrene/maleic anhydride, partially esterified (50/50) | 320 | 50,000 |
| Styrene/maleic anhydride, non-esterified (50/50) | 480 | 1,600 |
| Styrene/maleic anhydride, non-esterified (67/33) | 350 | 1,700 |
| Methyl methacrylate/methacrylic acid copolymer (92/8) | 59 | 70,000 |
| Methyl methacrylate/ethyl acrylate/ methacrylic acid copolymer (77/15/8) | 50 | 100,000 |
| Alkali-soluble thermoplastic resin-modified aliphatic polyester resin | 130 | — |
| Methyl methacrylate/methacrylic acid copolymer (82/7) | 119 | — |
| Methyl methacrylate/ethyl acrylate/acrylic acid copolymer (37/56/7) | 80 | 200,000 |
| Acrylic acid/alpha methyl styrene/styrene copolymer | 197 | 2,810 |

E. Plasticizer

Both the unpatterned layer and the imaging layer preferably contain substantial amount of plasticizers in which the polymer component of the unpatterned layer is at least partially soluble. The primary function of the plasticizer in both layers is to facilitate diffusion of the solubilizing agent from the imaging layer into the underlying and/or overcoating areas of the unpatterned layer. While it is not absolutely necessary to have plasticizer in both layers, it is nevertheless preferred because it gives greater imaging sensitivity. The plasticizers in the two layers may be the same or different so long as they meet the particular criteria for the layers. The plasticizer in the unpatterned layer(s) must (1) be capable of dissolving the polymer in the unpatterned layer, and (2) preferably capable of forming a solid two-phase system with the acidic polymer in the unpatterned layer. On the other hand, the plasticizer in the imaging layer must be a solvent for the binder polymer and solubilizing agent in the imaging layer, and for the acidic polymer in the unpatterned layer.

A wide range of plasticizers can be used to facilitate the penetration of the solubilizing agent into the polymer film that is to be patterned and to adjust the film properties. A plasticizer would be selected which shows reasonable compatibility with the binder and other components of the layers. With acrylic binders, for example, plasticizer can include dibutyl phthalate and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; chlorinated paraffins; and sulfonamide types can be used. In general, water insoluble plasticizers are preferred for greater high humidity storage stability and environmental operating latitude, but are not required.

F. Solids Components

It should be recognized that the method of the invention can be used to image organic layers alone as well as thick film and other filled layers. When the method is used for thick films, the solids component of the unpatterned layer will generally be a dielectric material such as glass or a mixture of glass-forming oxides, or conductive material such as precious metal powders, or powders providing special function such as phosphors and the like. These powders will densify and/or sinter when they are fired at elevated temperature for example, 500°–950° C. The chemical composition of the solids is not by itself important with respect to application of the invention so long as they are inert to the components of the organic medium.

The use of solids in the imaging layer is not always necessary. Nevertheless, the use of finely divided solids is a very useful way of obtaining appropriate rheological properties of the image paste for printing and subsequent processing in accordance with the invention. The composition of the solids in the imaging layers is not otherwise important since they are physically removed from the system by washing after completion of the diffusion patterning step.

The particle size of the solids is also uncritical. However, it should ordinarily be in the range of 0.5–20 microns in order to be useful for application by screen printing.

G. Imaging layer Polymer

The nature of the binder polymer is not critical within broad limits so long as the theological properties of the imaging layer are appropriate for method of application. It is not even an essential component when the layer is applied by ink jet printing. However, when the imaging layer is applied as a thick film paste, it is strongly preferred to use cellulosic polymers such as ethyl cellulose as the binder because of its water solubility and its very desirable thixotropic properties.

H. Solubilizing Agent

It is preferred that the solubilizing agent of the imaging layer be an organic base which is compatible with and preferably soluble in the plasticizer. The base can be either liquid or solid. When solid bases are used it is preferred that the melting points not exceed 120° C. Such materials include organic amines such as alkyl amines aromatic amines such as pyridine, morpholine and alkanol amines such as triethanolamine.

The diffusion patterned areas must be soluble or dispersible with an aqueous solution in the pH range of 5–8.5 among which water is preferred. If necessary, the resulting aqueous solution may contain a low level of a base, preferably the same base used in the patterning step to help reach the critical concentration and make the imaged areas dispersible without deleteriously affecting the undiffused areas. Optionally, low levels of water soluble surfactants may be present in the wash solution to facilitate the interaction between the base and the acidic polymer film.

I. Formulation and Application

The method of the invention is intended primarily for use as a functional layer in the fabrication of electronic components. Typically the imaging layer which contains solubilizing agent will range from 1 to 50 microns thickness while the underlying or overcoating unpatterned layers can be of much greater thickness, form 10 to 200 microns. The thickness of the imaging layer is limited chiefly by the method of application, rather than by considerations of operability.

Being relatively insensitive to the gravitational force, the solubilizing agent and plasticizer can be diffused in both downward and upward directions to facilitate and simplify the patterning method.

By and large, the individual steps for preparation of the component layers for the method of the invention are similar to those which are known by those skilled in the art of conventional thick film pastes.

SCREENS

A. Recessed Polygon

Typically, a 300, 325 or 400 mesh screen is used for printing the image pastes to achieve better resolution of the deposited paste onto the underlying layers. However, the additive effects of the "lateral spreading" and "lateral diffusion" are inevitable and it is necessary to minimize the above effects in order to produce straight edge features of the specified dimension by diffusion patterning process.

Figure 5:
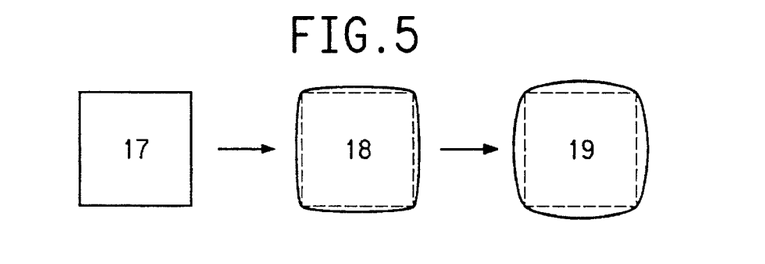
Figure 6:
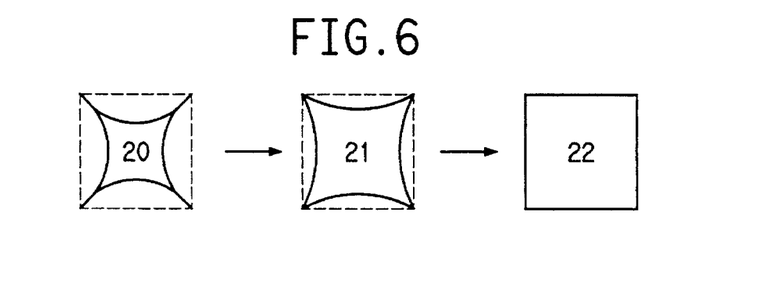

Screen printed patterns of the image paste are illustrated schematically at each step of the diffusion patterning process in FIGS. 5 and 6, solid line represents the shape of thick film deposit or cavity, whereas dashed line shows a square frame corresponding to aperture or emulsion opening of screen. FIG. 5 illustrates that, by use of a square emulsion opening 17 on screen, a rounded pattern 18 is deposited due to lateral spreading; the degree of "positive curvature" is further enhanced due to lateral diffusion, resulting in an unacceptable feature 19. On the contrary, FIG. 6 indicates a recessed emulsion opening design 20 has compensated the "lateral spreading" resulting in a smaller "negative curvature" 21, which ultimately reaches the desired square shape 22, after completing the diffusion patterning process in which the "lateral diffusion" effect is added.

Figure 7:
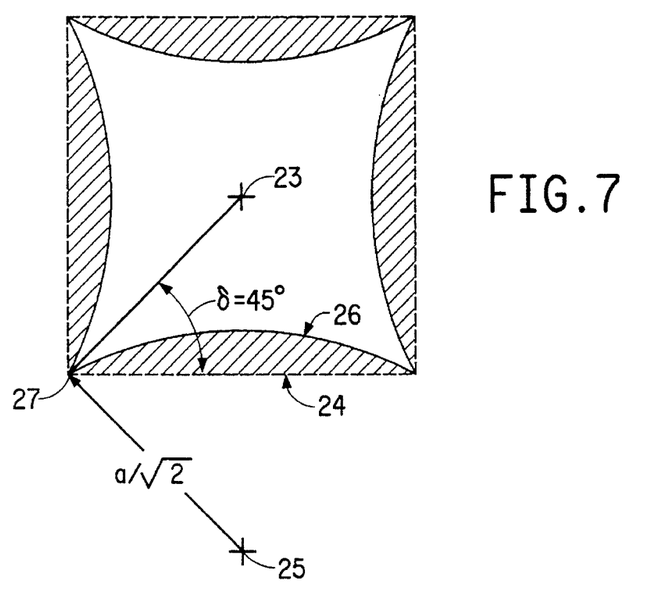
FIG. 7 is a schematic illustration of emulsion opening of a screen according to the present invention.

FIG. 7 exhibits specifically the design of an emulsion opening of a recessed square which actually constitutes a "hypocycloid of four cusps" where:

the center of Opening locates at 23 with the length of side 24 equal to a, origin 25 of arc 26 locates at a line perpendicular to and bisect the side 24 of concern, radius of arc equals a divided by square root of 2, q=45° to be between the tangential of arc 26 at one of the square vertex 27 and the side 24 of concern.

The angle q is 15° to 65° and preferably 35° to 45°. Because the degree of lateral spreading of paste from the forefront depends on its available quantity, the spreading is more pronounced at the central region of arc 26 than area neighboring any vertices such as point 27, due to the relatively local abundance of image paste. Since the spacing between arc 26 and straight line 24 is greater at central region versus vertices, the lateral spreading effect after printing the image paste is more than compensated by use of such a recess polygon design.

Figure 8:
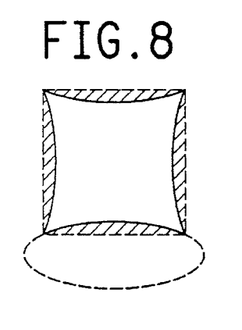
FIGS. 8–11 are showing another embodiments of the emulsion openings in accordance with the present invention.
Figure 9:
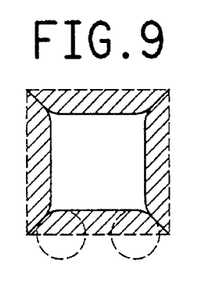
Figure 10:
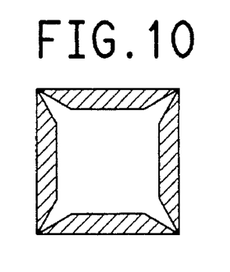
Figure 11:
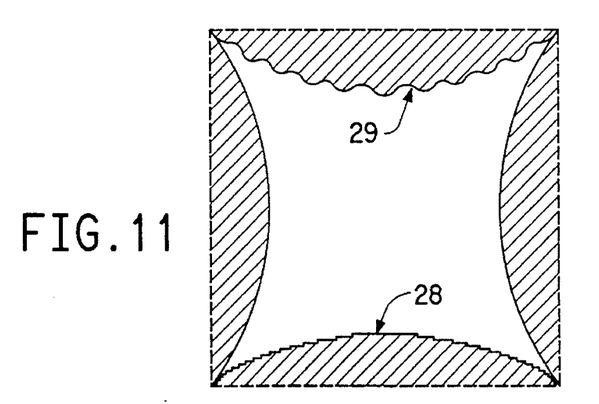

There are many ways to design an effective recessed emulsion opening other than the one shown in FIG. 7. For instance, FIG. 8 shows a recessed square consisting of four portions of an elliptical curve, FIG. 9 shows a design to combine straight line and short circular arcs, FIG. 10 depicts a recessed square with trapezoid type blockage, and FIG. 11 illustrates a modified version of FIG. 7 where arbitrary smaller scale perturbation takes place along each arc such as 28 and 29.

The recessed emulsion opening may be framed by circumference of a square, rectangle, diamond, parallelogram, hexagon, crisscross or any other geometrical shapes as deemed desirable for any specific circuit design.

Figure 12A:
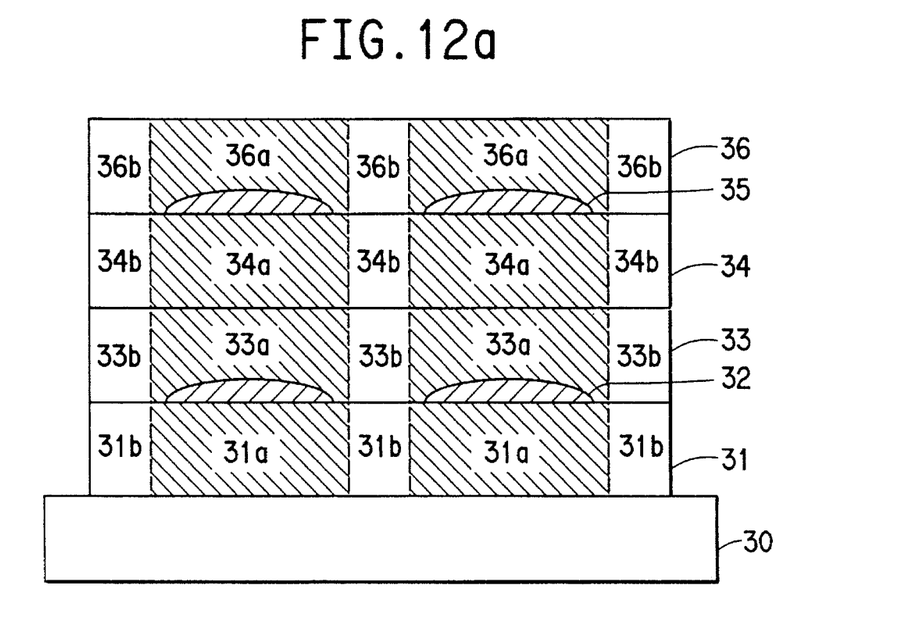
FIG. 12 illustrates diffusion patterning process using the screen according to the present invention, particularly the size of thick film deposit is changed responsive of place where it is screen printed in multilayered structure, and, FIG. 13 schematically depicts diffusion patterning process using alternative screen having grouped apertures and specially shows its behavior for diffusion patterning of the deposited thick film through such screen.
Figure 12B:
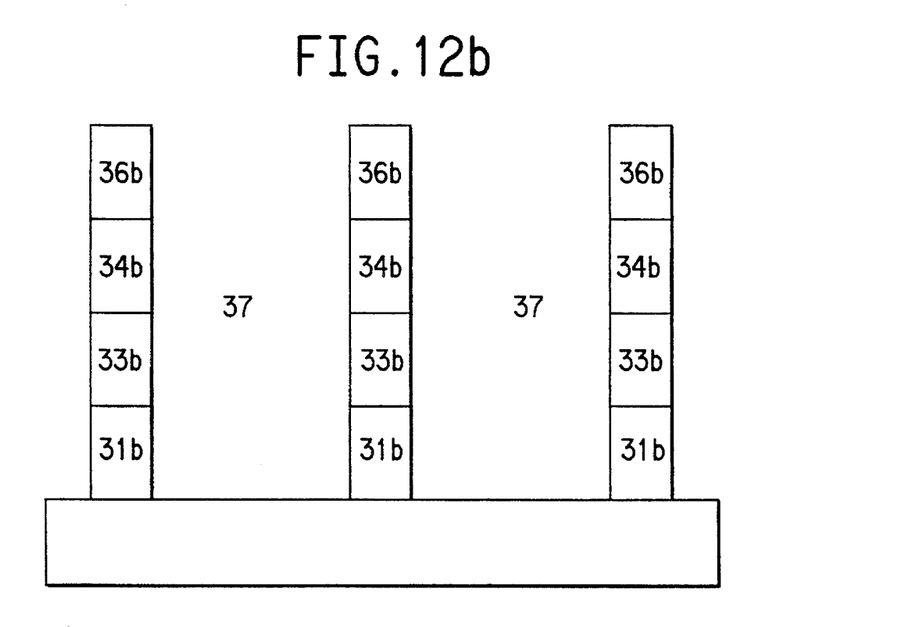

Furthermore, when plurality of unpatterned and imaging layers are applied onto substrate, it is recognized that the lateral, downward, and upward diffusion are all effective to introduce solubilizing agent from the imaging layer into its surrounding unpatterned layers. It is further suggested that screen with progressively smaller size, recessed polygon shape mesh opening be used in such multiple layer structure. FIG. 12 exhibits that the unpatterned layer 31 is printed and dried on substrate 30, the imaging layer 32 is printed and dried over with a screen having recessed polygon mesh opening according to the present invention. Another unpatterned layers 33 and 34 are printed and dried, followed by printing and drying a second imaging layer 35 with a screen of smaller size recessed polygon mesh opening, and printing and drying the final unpatterned layer 36. During each controlled drying step for the imaging layers, the solubilizing agent diffused into the neighboring unpatterned areas 31*a*, 33*a*, 34*a*, and 36*a* to induce solubility in the predetermined eluant. The above areas were washed out together with the residual imaging layers 32 and 35 to form cavity of higher aspect ratio whereas the undiffused areas 31*b*, 33*b*, 34*b*, and 36*b* remain intact.

B. Grouped Apertures

Besides being affected by the rheology of the imaging paste and compositions of both the imaging paste and paste to print the unpatterned underlying or overcoating layers, the degree of lateral spreading and lateral diffusion is also determined by the quantity of image paste deposited through any discrete aperture. Practically more image paste wall lead to greater size enlargement versus the aperture size arid vice versa.

It is further recognized that, due also to the additive effects of the lateral spreading and the lateral diffusion, printed imaging pattern originated from two discrete apertures will produce an integrated feature after the diffusion patterning process, provided the spacing between the two apertures is up to about 75 to 80 u, preferably to be 25 to 50 u.

Figure 13A:
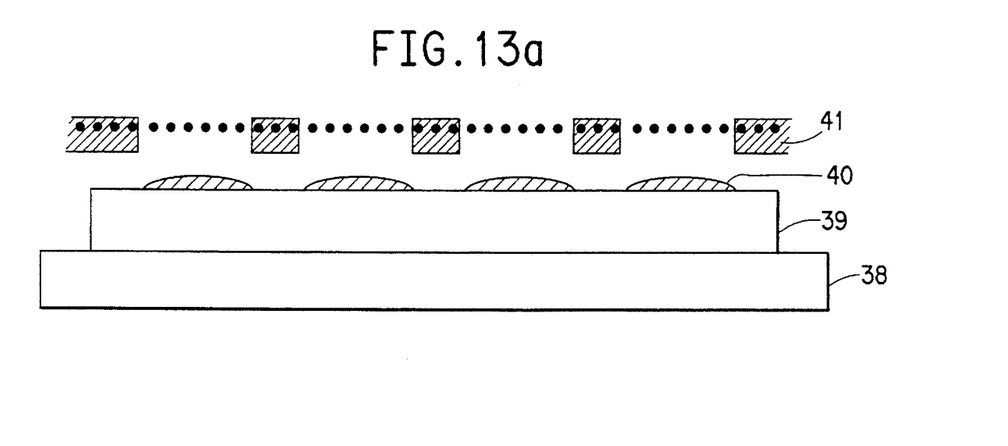
Figure 13B:
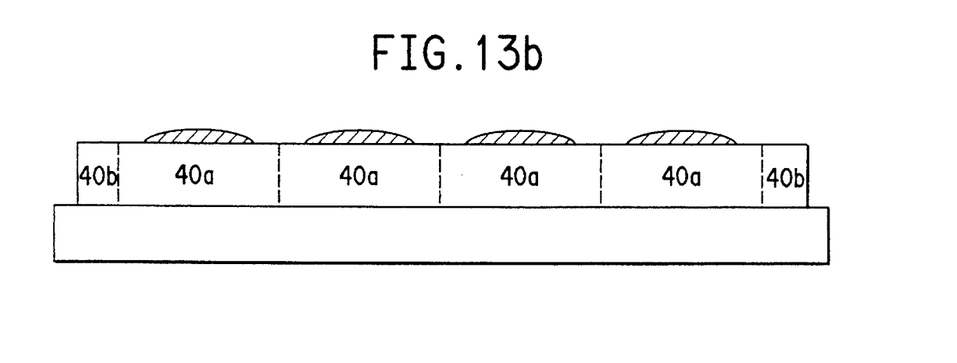
Figure 13C:
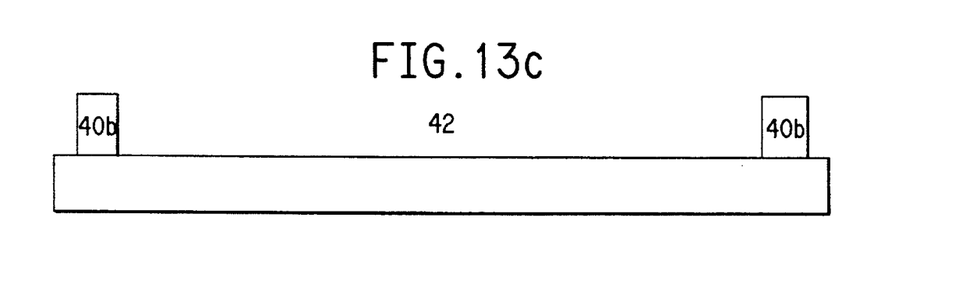

The above recognition is specially useful when fine channels (such as 100 to 200 u wide and 100 to 1,000 u long) with high aspect ratio (such as depth Z width X>/=1) are to be produced. FIG. 13 illustrates schematically that effect. The imaging layer 40 is printed onto unpatterned layer 39 by use of a screen 41 with a plurality of grouped apertures. These grouped apertures are made of relatively smaller size apertures such as 75 to 150 u wide and 500 to 1,000 u long with predetermined spacing such as 25 u diffuses the solubilizing agent into areas 40*a*. These areas merge with one another and are completely washed out to produce an integrated feature 42 representing the compounded effect of the grouped apertures.

What is claimed is:

1. A screen for screen printing diffusion patterning pastes comprising a rigid frame, mesh fixed tightly to the frame and an emulsion layer which forms a plurality of polygons of which each geometrical boundary of a side of a polygon is recessed from a straight line that connects the adjacent sides of the polygon.

2. The screen of claim 1 wherein the polygon degree of recess is controlled by the rheology of the emulsion layer.

3. The screen of claim 1 wherein the polygon is a square and the sides are hypocycloid of four cusps.

4. The screen of claim 1 further comprising a metallic stencil with an emulsion layer which forms a plurality of polygons of which each geometrical boundary of a side of a polygon is recessed from a straight line that connects the adjacent sides of the polygon.

5. The screen of claim 1 further comprising a metallic stencil.

* * * * *